(12) United States Patent
Chen et al.

(10) Patent No.: US 8,253,364 B2
(45) Date of Patent: Aug. 28, 2012

(54) HEAT-DISSIPATING DEVICE AND METHOD FOR CONTROLLING FAN SPEED

(75) Inventors: Chien-Fu Chen, Taipei Hsien (TW); Wan-Neng Su, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 825 days.

(21) Appl. No.: 12/411,414

(22) Filed: Mar. 26, 2009

(65) Prior Publication Data

US 2010/0097025 A1    Apr. 22, 2010

(30) Foreign Application Priority Data

Oct. 20, 2008   (CN) .......................... 2008 1 0305030

(51) Int. Cl.
*H02P 1/04* (2006.01)
(52) U.S. Cl. ......... 318/471; 318/461; 318/472; 318/473
(58) Field of Classification Search .................. 318/471, 318/472, 473, 478, 461
See application file for complete search history.

(56) References Cited

U.S. PATENT DOCUMENTS

| | | | |
|---|---|---|---|
| 6,194,858 B1 * | 2/2001 | Chen | 318/473 |
| 6,390,379 B1 * | 5/2002 | Huang | 236/49.3 |
| 6,551,065 B2 * | 4/2003 | Lee | 417/32 |
| 7,235,943 B2 * | 6/2007 | Hsiang et al. | 318/471 |
| 7,271,561 B2 * | 9/2007 | Chen et al. | 318/473 |
| 7,291,995 B2 * | 11/2007 | Chen | 318/268 |
| 2004/0228091 A1 * | 11/2004 | Miyairi | 361/695 |
| 2005/0047762 A1 * | 3/2005 | Liu et al. | 388/806 |
| 2007/0142976 A1 * | 6/2007 | Tezuka | 700/300 |
| 2007/0210736 A1 * | 9/2007 | Ishii et al. | 318/471 |

FOREIGN PATENT DOCUMENTS

TW    200506589    2/2005

* cited by examiner

*Primary Examiner* — Walter Benson
*Assistant Examiner* — Thai Dinh
(74) *Attorney, Agent, or Firm* — Altis Law Group, Inc.

(57) ABSTRACT

A method for controlling fan speed is disclosed. Firstly, a number of temperature ranges are defined. Each temperature range is associated with a corresponding fan speed. Each two adjacent temperature ranges overlap. The temperature of an electronic system is measured and is compared with the defined temperature ranges to determine whether it enters into a new range. If the measured temperature exceeds any one of the limits of a temperature range associated with the current fan speed, it enters into a new temperature range. The fan speed is adjusted to which is associated with the new entered temperature range. The overlap of each two adjacent temperature ranges covers the fluctuation of the temperature of the electronic system caused solely by the adjustment of fan speed caused by the traversing of the measured temperature between the two adjacent temperature ranges.

5 Claims, 3 Drawing Sheets

HEAT-DISSIPATING DEVICE AND METHOD FOR CONTROLLING FAN SPEED

BACKGROUND

1. Technical Field

The disclosure relates to a heat-dissipating device and a method for controlling fan speed.

2. Description of the Related Art

Heat-dissipating devices are widely used in various electronic systems to bring excess heat out of the electronic systems. A heat-dissipating device includes a thermometer, a controller, and a fan. The thermometer can measure current working temperature of an electronic system. The controller can control the speed of the fan based upon the measured temperature. For example, the controller reads the measured temperature and compares the read current temperature with a threshold and increases/decreases the speed of the fan when the read current temperature is higher/lower than the threshold. However, in operation, the increase/decrease in speed of the fan may alter the measured temperature. As a result, the measured temperature may fluctuate about the threshold, causing the fan speed to be unstable due to frequent adjustment. This kind of control is harmful to the fan and is noisy.

Therefore, it is desirable to provide a heat-dissipating device and a method for controlling fan speed, which can overcome the limitations described above.

DETAILED DESCRIPTION OF THE EMBODIMENTS

Embodiments of the disclosure are described in detail here with reference to the drawings.

Figure 1:
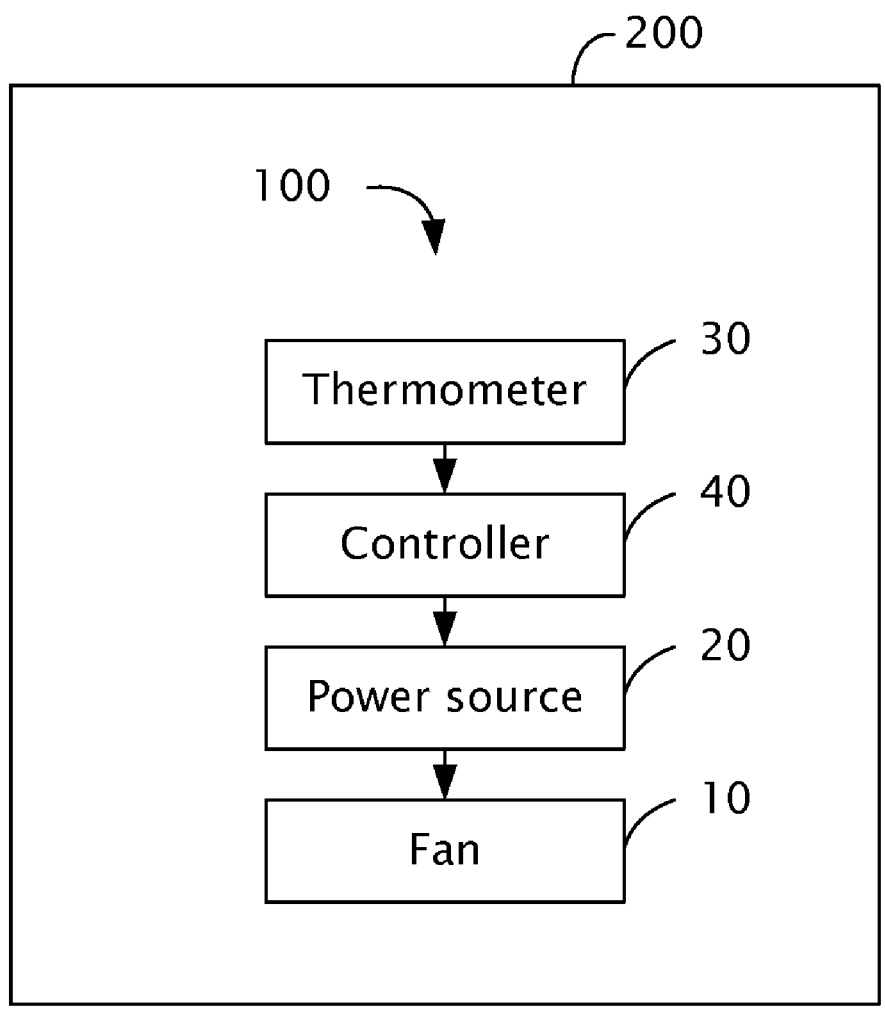
FIG. 1 is a functional block diagram of a heat-dissipating device, according to an exemplary embodiment.

Referring to FIG. 1, a heat-dissipating device 100, according to an exemplary embodiment, is configured for cooling an electronic system 200. The heat-dissipating device 100 includes a fan 10, a power source 20, a thermometer 30, and a controller 40.

The fan 10 is configured for drawing cool air into and meanwhile expelling warm air out of the electronic system 200 and can be operated at different speeds.

The power source 20 can supply various levels of output, each of which can drive the fan 10 to be operated at a corresponding speed.

The thermometer 30 is configured for measuring current working temperature of the electronic system 200.

The controller 40 presets a number of temperature ranges. Each temperature range is associated with a corresponding level of output of the power source 20. Each two adjacent temperature ranges overlap with each other. The controller 40 is configured for detecting whether the measured temperature falls into a new temperature range by detecting whether the measured temperature exceeds any one of the limits of a temperature range associated with the current speed of the fan 10 and, if yes, adjusting the level of output of the power source 20 to drive the fan 10 to be operated at a new speed which is associated with the new temperature range. The overlap of each two adjacent temperature ranges covers the fluctuation of the temperature of the electronic system 200 caused solely by the adjustment of speed of the fan 10 due to traversing of the measured temperature between the two temperature ranges.

Figure 2:
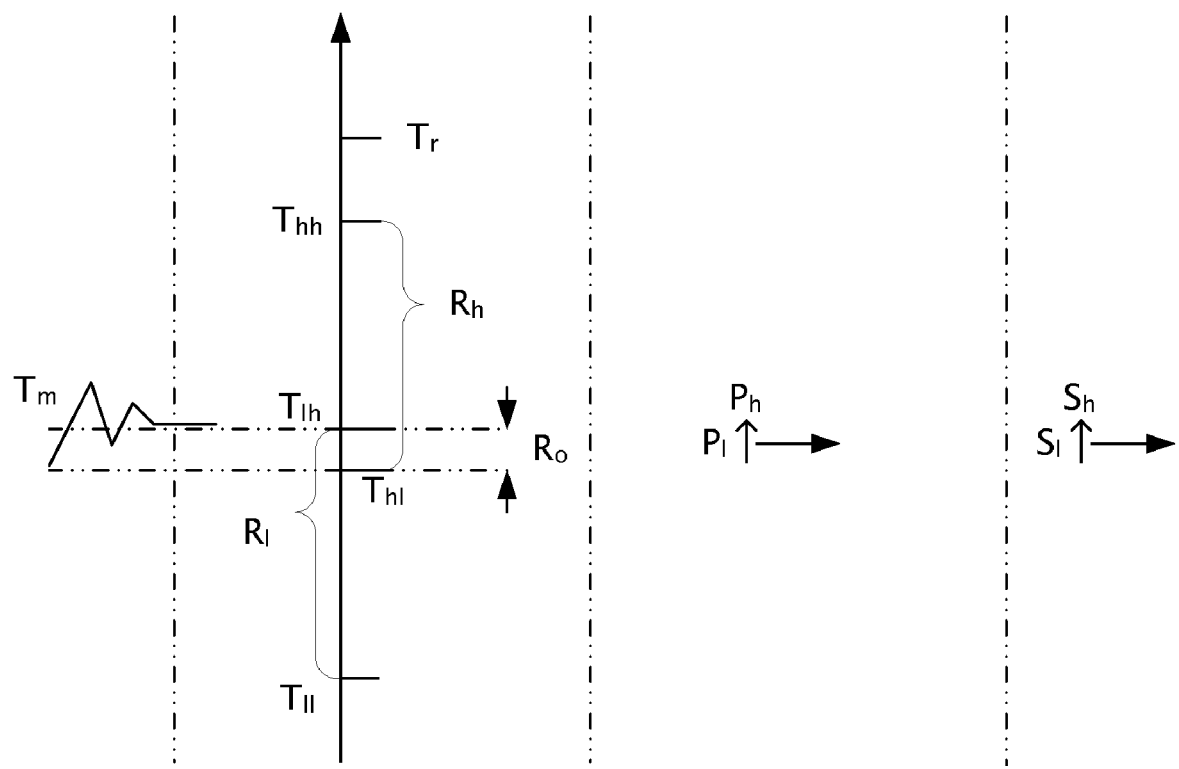
FIG. 2 is a schematic view showing working principle of an example of the heat-dissipating device of FIG. 1.

Referring to FIG. 2, in this embodiment, the fan 10 can be operated at two speeds $S_1$, $S_h$ (unit: n/s). The power source 20 can supply two levels of output $P_1$, $P_h$ (unit: watt). $T_m$ represents the measured temperature of the thermometer 30. The controller 40 presets a low temperature range $R_1$ and a high temperature range $R_h$ (unit: °C.). The low limit and high limit of the low temperature range $R_1$ are $T_{1l}$, $T_{1h}$. The low limit and high limit of the high temperature range $R_h$ are $T_{h1}$, $T_{hh}$. Since the low temperature range $R_1$ and the high temperature range R2 overlap with each other, $T_{1l}$, $T_{h1}$, $T_{1h}$, $T_{hh}$ satisfy the formula: $T_{1l} < T_{h1} < T_{1h} < T_{hh}$. The overlap of the low temperature range $R_1$ and the high temperature range $R_h$ is $R_o$: $T_{h1} \sim T_{1h}$.

As shown in FIG. 2, if at a time, workload of the electronic system 200 increases, the measured temperature $T_m$ increases and ascends from the low temperature range $R_1$ through the high limit $T_{1h}$ into the high temperature range $R_h$. Accordingly, the controller 40 increases the level of output of the power source 20 to $P_h$ from $P_1$ and the speed of the fan 10 will be increased to $S_h$ from $S_1$. Since the speed of the fan 10 increases, the measured temperature $T_m$ may have a sudden drop and may fall down into the low temperature range $R_1$, also the overlap $R_o$. However, the controller 40 does not response to this traversing of temperature ranges until the measured temperature drops below the overlap range, i.e. below the low limit $T_{h1}$ of the high temperature range $R_h$. This feature can prevent the speed of the fan 10 from switching between $S_h$ and $S_1$ repeatedly during adjustment thereof.

Inversely, if the electronic system 200 slows down, similar control can be performed.

The overlap of the two temperature ranges R1, R2 must be greater than the fluctuation (decrease/increase) of the temperature of the thermometer 20 (i.e., the temperature of the electronic system 200) caused solely by the adjustment of the speed of the fan 10. This fluctuation of the temperature is determined by the thermal properties of the electronic system 200. Therefore, the overlap of the temperature ranges depends on the thermal properties of the electronic system 200.

In this embodiment, the controller 40 also presets a rating temperature $T_r$. The rating temperature Tr is a little greater than the high limit $T_{hh}$ of the highest temperature range $R_h$. If the measured temperature goes beyond the rating temperature $T_r$, the controller 40 will shut down the electronic system 200.

Figure 3:
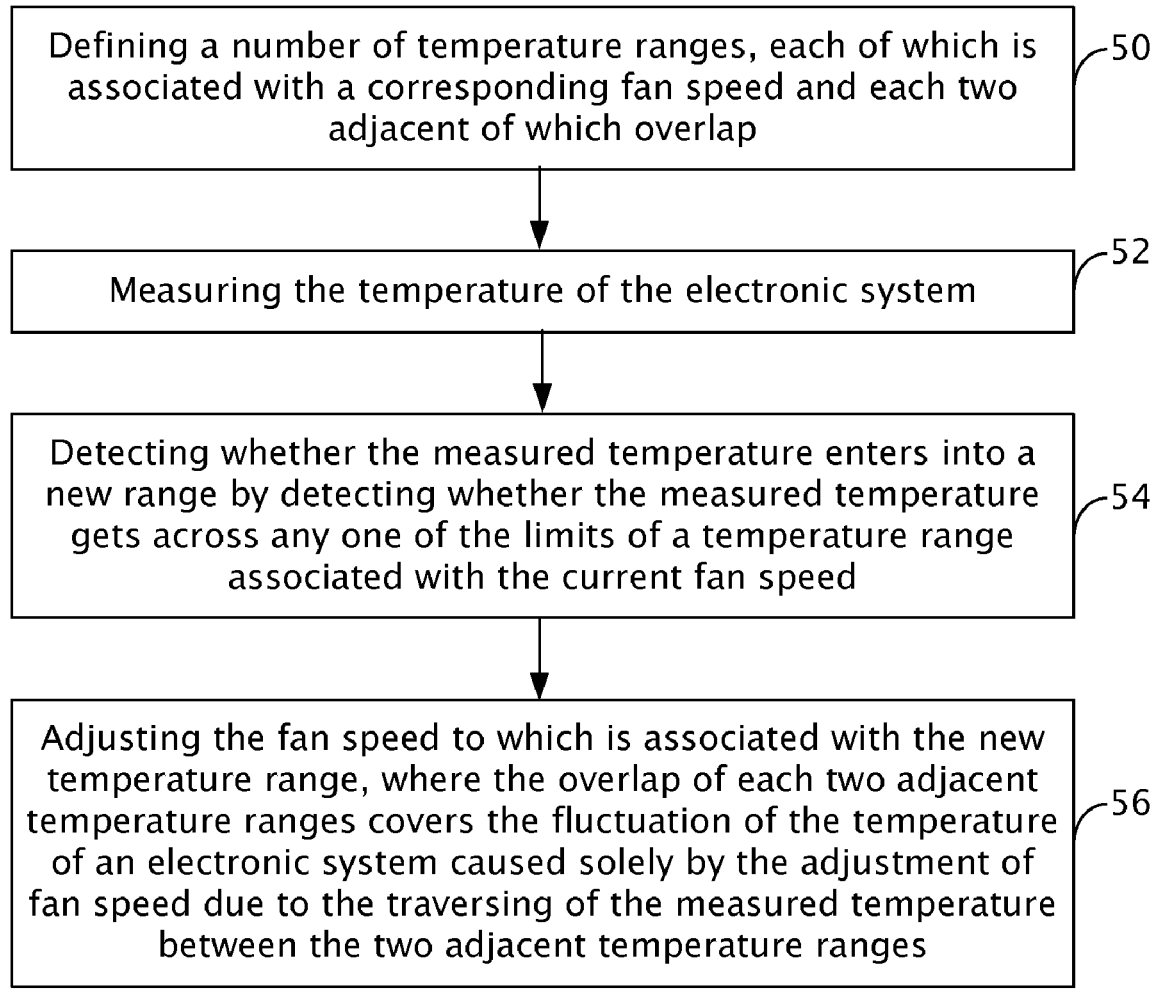
FIG. 3 is a flowchart of a method for controlling fan speed, according to another exemplary embodiment.

Referring to FIG. 3, a method for controlling fan speed, according to another examplary embodiment, can be exemplarily applied to the electronic system 200 and implemented by the heat-dissipating device 100. The method includes the following steps:

S52: defining a number of temperature ranges, each of which is associated with a corresponding fan speed and each two adjacent temperature ranges overlap each with other, where the overlap of each two adjacent temperature ranges covers the fluctuation of the temperature of the electronic system 200 caused solely by the adjustment of fan speed due to traversing of the measured temperature between the two adjacent temperature ranges, S52: measuring the temperature of the electronic system 200;

S54: detecting whether the measured temperature falls into a new range by detecting whether the measured temperature exceeds any one of the limits of a temperature range associated with the current fan speed; and S56: adjusting the fan speed to which is associated with the new temperature range.

While the disclosure has been described by way of example and in terms of preferred embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat-dissipating device for cooling an electronic system, comprising:
   a fan capable of being operated at more than one speed;
   a power source capable of supplying more than one level of output, each of which is capable of driving the fan to be operated at a corresponding speed;
   a thermometer capable of measuring temperature of the electronic system; and
   a controller defining more than one temperature range therein, each of which is associated with a corresponding level of output of the power source and each two adjacent of which overlap,
   wherein the controller being capable of detecting whether the measured temperature enters into a new temperature range by detecting whether the measured temperature exceeds any one of the limits of a temperature range associated with the current speed of the fan and, if yes, adjusting the level of output of the power source to drive the fan to be operated at a new speed which is associated with the new temperature range;
   wherein the overlap of each two adjacent temperature ranges covers the fluctuation of the temperature of the electronic system caused solely by the adjustment of the fan speed.

2. The heat-dissipating device as claimed in claim 1, wherein the controller presets a rating temperature, the rating temperature being greater than the high limit of the highest temperature range, the controller being configured for shutting down the electronic system when the measured temperature exceeds the rating temperature.

3. An electronic system comprising:
   a heat-dissipating device for cooling an electronic system, comprising:
   a fan capable of being operated at more than one speed;
   a power source capable of supplying more than one level of output, each of which is capable of driving the fan to be operated at a corresponding speed;
   a thermometer capable of measuring temperature of the electronic system; and
   a controller defining more than one temperature range therein, each of which is associated with a corresponding level of output of the power source and each two adjacent of which overlap,
   wherein the controller being capable of detecting whether the measured temperature enters into a new temperature range by detecting whether the measured temperature exceeds any one of the limits of a temperature range associated with the current speed of the fan and, if yes, adjusting the level of output of the power source to drive the fan to be operated at a new speed which is associated with the new temperature range;
   wherein the overlap of each two adjacent temperature ranges covers the fluctuation of the temperature of an electronic system caused solely by the adjustment of the fan speed.

4. The electronic system as claimed in claim 3, wherein the controller presets a rating temperature, the rating temperature being greater than the high limit of the highest temperature range, the controller being configured for shutting down the electronic system when the measured temperature exceeds the rating temperature.

5. A method for controlling fan speed for an electronic system, comprising:
   defining a number of temperature ranges, each of which is associated with a corresponding fan speed and each two adjacent of which overlap;
   measuring the temperature of the electronic system;
   detecting whether the measured temperature enters into a new range by detecting whether the measured temperature exceeds any one of the limits of a temperature range associated with the current fan speed; and
   adjusting the fan speed to which is associated with the new entered temperature range;
   wherein the overlap of each two adjacent temperature ranges covers the fluctuation of the temperature of an electronic system caused solely by the adjustment of fan speed due to traversing of the measured temperature between the two adjacent temperature ranges.

* * * * *